United States Patent [19]

Matsunaga

[11] Patent Number: 4,982,252
[45] Date of Patent: Jan. 1, 1991

[54] SOLID STATE IMAGING DEVICE
[75] Inventor: Yoshiyuki Matsunaga, Kamakura, Japan
[73] Assignee: Kabushiki Kaisha Toshiba, Kawasaki, Japan
[21] Appl. No.: 175,253
[22] Filed: Mar. 30, 1988
[30] Foreign Application Priority Data Mar. 31, 1987 [JP] Japan .................................. 62-79155

[51] Int. Cl.⁵ .......................................... H01L 29/78
[52] U.S. Cl. ...................................... 357/24; 357/30; 357/59; 357/71; 357/84
[58] Field of Search ................. 357/24 LR, 30, 59, 71

[56] References Cited
U.S. PATENT DOCUMENTS 4,394,675 7/1983 Anagnostopoulos et al. ........ 357/24
4,743,778 5/1988 Takatsu et al. ........................ 357/24

OTHER PUBLICATIONS

Kano et al., "Interline Transfer Type CCD Imaging Device," Report of the Institute of Television Engineers of Japan ED481, Jan. 24, 1980, pp. 47-52.
"Sony Unveils CCD Color Camera for Home TV", Electronics International, Mar. 30, 1978, vol. 51, No. 7 (1978.03), pp. 59-60.

Primary Examiner—Edward J. Wojciechowicz
Attorney, Agent, or Firm—Foley & Lardner Schwartz, Jeffery, Schwaab, Mack, Blumenthal & Evans

[57] ABSTRACT

A solid state imaging device comprising a light receiving and accumulating element disposed at a surface area of a semiconductor substrate in a two-dimensional arrangement, a control electrode and a transfer electrode for transferring a signal charge which is photoelectrically converted by the light receiving element, and a light shield element for passing an incident light only toward to a predetermined portion of the light receiving element. These elements are suitably electrically insulated by the positions of insulation films. The control electrode constitutes a first electroconductive element disposed above the light receiving element and the transfer electrode so as to cover at least portions thereof. The imaging device further comprises a second electroconductive element disposed in direct contact with the lower surface of the first electroconductive element to lower the resistance thereof. The second electroconductive element may be constituted by a low resistance electrode or by the light shield element.

9 Claims, 2 Drawing Sheets

SOLID STATE IMAGING DEVICE

BACKGROUND OF THE INVENTION

This invention relates to a solid state imaging device particularly used for an imaging unit for a video camera.

A solid state imaging device generally comprises a photodiode array and a transfer section such as a charge coupled device (CCD) for transferring signal charges generated in the photodiode array. The transfer section such as a CCD includes an impurity diffusion region constituting a transfer channel formed in a substrate and a control electrode which is made of light transmissible thin film and disposed above the transfer electrode through an insulation film. An aluminium film as a light shield means is formed on the control electrode through an insulation film.

With the solid state imaging device of the type described above, in order to attain a high speed operation, it is necessary to lower the resistance of the control electrode by making electric contact between the control electrode and the aluminium film. For this purpose, a contact hole is formed in the insulation film interposed between the aluminium film and the control electrode. However, since the insulation film interposed between the control electrode and the transfer electrode is very thin and control of the etching depth is difficult, the contact hole may reach the transfer electrode. This results in a short circuit, which will lower the yield of the products. On the other hand, in order to obviate the lowering of the yield, it is unavoidably necessary to operate the imaging device with inadequate characteristics or performance.

SUMMARY OF THE INVENTION

An object of this invention is to substantially eliminate the difficulties or problems encountered with the prior technique and to provide an improved solid state imaging device including a control electrode with a lowered resistance capable of operating the imaging device at high speed.

Another object of this invention is to provide a solid state imaging device which is produced without using a difficult process, thus resulting in a high yield.

These and other objects can be achieved according to this invention by providing a solid state imaging device comprising a semiconductor substrate, light receiving and accumulating means disposed in two-dimensional arrangement at a surface area of the semiconductor substrate for photoelectrically converting a received incident light into a signal charge and accumulating it, electric charge transferring means including a control electrode for reading the signal charge from the light receiving and accumulating means, transfer means for transferring the signal charge, and a light shield for passing the incident light selectively directing to a predetermined portion of the light receiving and accumulating means, the control electrode comprising a first electroconductive means located above the light receiving and accumulating means and the transfer electrode so as to cover at least portions thereof in a manner electrically insulated therefrom, the imaging device further comprising a second electroconductive means disposed below the first electroconductive means in direct contact with the lower surface thereof so as to lower the resistance of the first electroconductive means.

In one preferred embodiment of the invention, the second electroconductive means is a low resistance electrode made of a material such as a doped polysilicon or silicide of a refractory metal. In another embodiment of the invention, the light shield element made of an aluminium film acts as the second electroconductive means.

According to the aforementioned construction of the solid state imaging device of this invention, superior operational characteristics and performance can be achieved by lowering the resistance of the control electrode without incurring a short circuit between the transfer electrode and the control electrode.

The preferred embodiments of this invention will be described further in detail hereunder with reference to the accompanying drawings.

DESCRIPTION OF THE PREFERRED EMBODIMENTS

For a better understanding of this invention, a conventional solid state imaging device and defects or drawbacks encountered therewith will be described hereunder with reference to FIG. 1 in advance of the description of the preferred embodiment of this invention.

Figure 1:
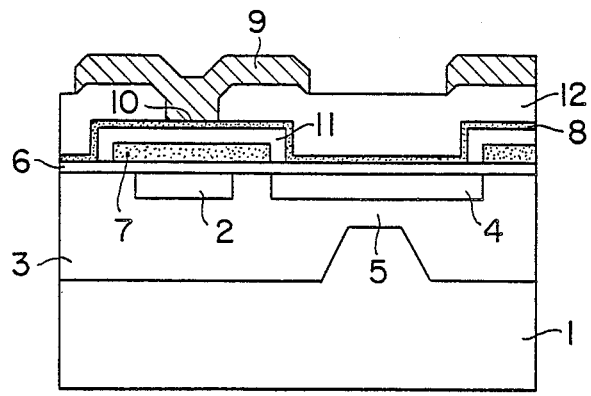
FIG. 1 is a sectional view of a portion of a conventional solid state imaging device.

Referring to FIG. 1 showing a sectional view of a typical conventional solid state imaging device, an n-type semiconductor substrate 1 is provided with a well region including a first p-type well 3 having a relatively deep depth and a second p-type well 5 having a relatively shallow depth and constituting a part of the first p-type well 3. A first n-type impurity diffusion region 2 forming a transfer channel of a charge coupled device (CCD) is formed in the surface of the semiconductor substrate 1 corresponding to the position of the first p-type well 3, and a second n-type impurity diffusion region 4 forming a photodiode element as a light receiving and accumulating section for photoelectrically converting an incident light and accumulating a converted signal charge is also formed in the surface of the semiconductor substrate 1 corresponding to the position of the second p-type well 5. An insulation film 6 is disposed on the surface of the semiconductor substrate 1, and a transfer electrode 7 is disposed on the insulation film 6 at a portion thereof corresponding to the first n-type impurity diffusion region 2. A control electrode 8 is further disposed on the transfer electrode 7 over an insulation film 11 and extends over the second n-type impurity diffused region 4 forming the photodiode element A layer insulation film 12 is further disposed on the control electrode 8, and an aluminium film 9 is further disposed on the insulation film 12 as a light shield means for leading the incident light only to the photodiode.

Recently, in the field of this art, a thin polysilicon film having a film thickness of about 100 Å has been generally used for forming the control electrode 8. The polysilicon film, however, has a high resistance, and the use thereof may often adversely affect the operation of the device.

In order to overcome this defect, in the prior technique, a contact hole is formed in the insulation film 12 to cause the control electrode 8 to contact the aluminium film 9 thereby to reduce the resistance of the control electrode 8. However, since the insulation film 11 disposed between the contact electrode 8 and the transfer electrode 7 has a thickness of about 1000 Å, which is not very thick, there is a possibility that the contact hole will reach the transfer electrode 7 when an inadequate etching condition is used. Thus, in a certain adverse case, a short circuit will occur between the control electrode 8 and the transfer electrode 7.

As described above, according to the construction of the conventional solid state imaging device, it is considerably difficult to establish the contact between the aluminium film 9 and the control electrode 8 to lower the resistance of the control electrode 8 because of the possibility of the occurrence of the short circuit.

A solid state imaging device of this invention will be described hereinbelow with reference to preferred embodiments shown in FIGS. 2 through 4.

Figure 2:
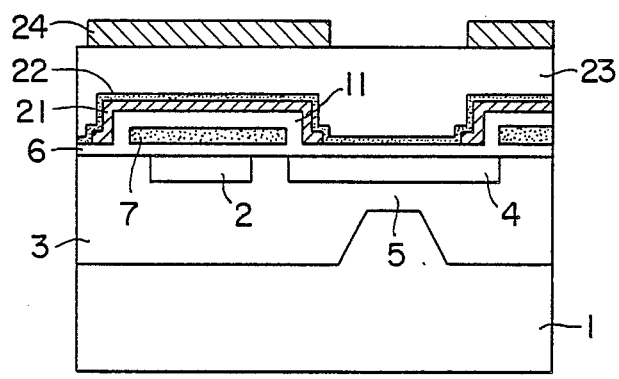
FIG. 2 is a sectional view of a portion of a solid state imaging device according to one embodiment of this invention.
Figure 3:
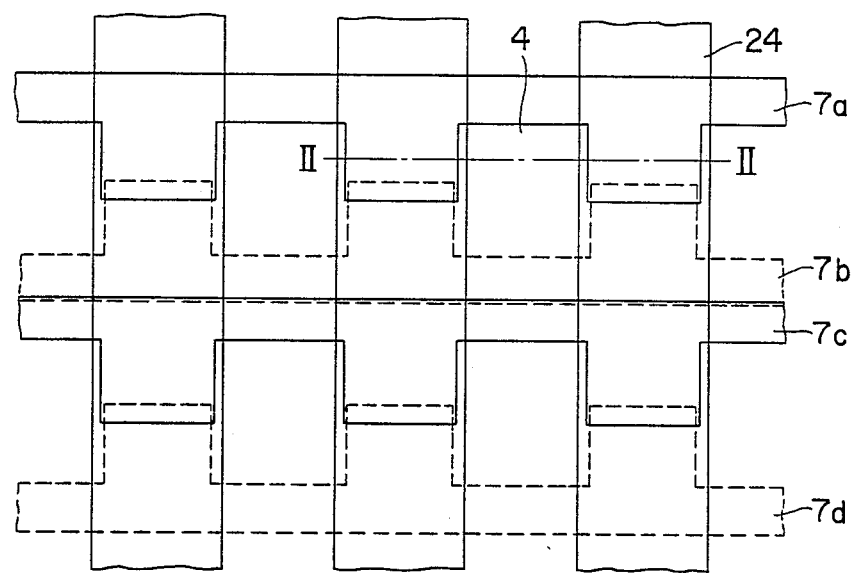
FIG. 3 is a plan view representing a main portion of the imaging device shown in FIG. 2.

FIG. 2 shows a sectional view of one preferred embodiment of this invention taken along the dot-and-dash line II—II in FIG. 3 showing a part of an interline transfer type solid state imaging device having transfer electrodes 7a to 7d.

Referring to FIG. 2, as described with reference to FIG. 1, the n-type semiconductor substrate 1 is provided with a well region including a first p-type well 3 having a relatively deep depth and a second p-type well 5 having a relatively shallow depth and constituting a part of the first well 3. A first n-type impurity diffusion region 2 forming a transfer channel for a CCD is formed at the surface area of the semiconductor substrate 1 at a portion corresponding to the first p-type well 3. A second n-type impurity diffusion region 4 constituting a photodiode is formed at the surface area of the semiconductor substrate 1 at a position corresponding to the second p-type well 5. On the surface of the semiconductor substrate 1 is disposed an insulation film 6 on which a transfer electrode 7 is provided at a portion corresponding to the position of the first n-type impurity diffusion region 2.

An electrode 21 with a low resistance having a thickness of about 4000 to 5000 Å is disposed so as to cover the upper and side portions of the transfer electrode 7 over an insulation film 11 interposed between the low resistance electrode 21 and the transfer electrode 7. The low resistance electrode 21 is preferably made of a polysilicon produced by the ion implantation of an impurity such as phosphorus or of silicide of a refractory metal such as molybdenum silicide.

A control electrode 22 made of a polysilicon film into which an impurity such as phosphorus has been ion-implanted and which has a thickness less than 0.05 $\mu$m is disposed so as to cover the low resistance electrode 21 and the photodiode. A phosphorus diffusion process in a phosphorus atmosphere which has been often utilized is not suitable as a process for imparting an electroconductivity to the control electrode for the reason that the phosphorus diffusion increases the etching rate of the polysilicon used, and the control electrode having the thin polysilicon film may be adversely etched in the processes following thereafter.

A layer insulation film 23 is formed over the control electrode 22, and an aluminium film 24 is further formed on the layer insulation film 23, the aluminium film 24 being provided with an opening corresponding to the position of the photodiode for transmitting incident light only through the photodiode.

In the foregoing description, the construction of the solid state imaging device has been described with respect to one section with reference to the description of the drawing, but the imaging device as a product is ordinarily constructed in the continuous sections each referred to above. In other words, for example, in the imaging device as a product, the impurity diffusion regions 2 and 4 are formed in a two-dimensional arrangement.

According to the solid state imaging device of this invention of the construction described above, the location of the low resistance electrode 21 serves to lower the resistance of the control electrode 22, and accordingly, it is not necessary to provide an electric contact between the control electrode and aluminium film, so the occurrence of a short circuit between the control electrode and the transfer electrode is prevented. In addition, since the low resistance electrode can be stably formed, the yield of the solid state imaging device as a product can be improved.

Figure 4:
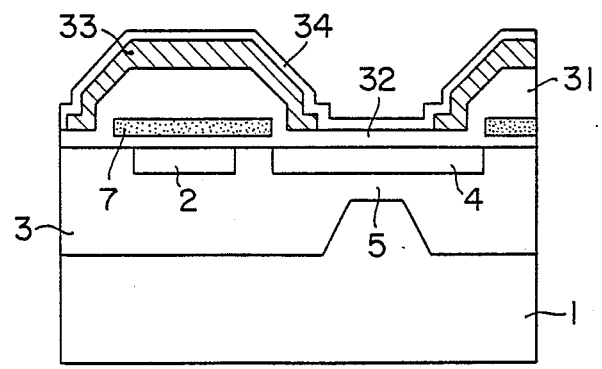
FIG. 4 is a sectional view of another embodiment of this invention.

FIG. 4 is a sectional view, similar to that shown in FIG. 2, showing another embodiment of the part of the solid state imaging device according to this invention. In FIG. 4, like reference numerals are used for elements or parts corresponding to those shown in FIG. 2 and the explanation thereof is not repeated.

In the example shown in FIG. 4, the insulation film, corresponding to the insulation film 11 of the first embodiment of the invention shown in FIG. 2, comprises a first portion 31 formed above the transfer electrode 7 and a second portion 32 formed above the photodiode and having a thickness considerably thinner than that of the first portion 31. Accordingly, the upper surface of the insulation film 31 is formed as an inclined surface at the peripheral portion of the transfer electrode 7. A light shield film 33 made of aluminium is formed above the transfer electrode 7 so as to cover the same through the insulation film 31, and a transparent electroconductive film 34 made of a material such as tin oxide is formed above the light shield film 33 and the photodiode. The electroconductive film 34 acts as a control electrode, and the resistance thereof is low because of the direct contact of the electroconductive film 34 with the aluminium light shield film 33. The electroconductive film 34 of the tin oxide is ordinarily formed by a deposition or sputtering method.

The insulation films 31 and 32 of this example can be fabricated by an etch-back process to a thick film once formed by a known CVD (Chemical Vapor Deposition) method. The aluminium film 33 is also formed by a known deposition method.

According to this embodiment of this invention, since the aluminium film as a light shield film and the tin oxide film as a control electrode can be stably formed, a solid state imaging device having excellent characteristics and performance can be produced by utilizing the control electrode having low resistance, thus improving the yield of the imaging device as a product.

What is claimed is:

1. A solid state imaging device comprising:
   a semiconductor substrate;

light receiving and accumulating means disposed at a surface area of said semiconductor substrate in a two-dimensional arrangement for photoelectrically converting received incident light into a signal charge and for accumulating said signal charge;

transfer means for transferring said signal charge;

first electroconductive means, disposed above said light receiving and accumulating means and said transfer means to cover at least portions of said light receiving and accumulating means and said transfer means in a manner electrically insulated from said light receiving and accumulating means and said transfer means, for transferring said signal charge from said light receiving and accumulating means to said transfer means as a control electrode;

light shield means for passing incident light only towards predetermined portions of said light receiving and accumulating means; and second electroconductive means, disposed below said first electroconductive means to directly contact a lower surface of said first electroconductive means over an area of said transfer means, for lowering the resistance of said first electroconductive means.

2. The imaging device according to claim 1 wherein said transfer means comprises a plurality of transfer electrodes, and said second electroconductive means comprises a low resistance electrode disposed above and electrically insulated from said transfer electrode to cover at least the location of said transfer electrode.

3. The imaging device according to claim 2 wherein said low resistance electrode is made of polysilicon in which an impurity is doped.

4. The imaging device according to claim 2 wherein said low resistance electrode is made of a silicate of a refractory metal.

5. The imaging device according to claim 1 wherein said control electrode comprises a light transmitting polysilicon film made by ion-implanting an impurity.

6. The imaging device according to claim 1 wherein said light shield means is made of an aluminium film and disposed above a portion of said control electrode in a manner electrically insulated therefrom.

7. The imaging device according to claim 1 wherein said light shield means is disposed below said control electrode in direct contact therewith to act to lower the resistance of said control electrode.

8. The imaging device according to claim 7 wherein said control electrode comprises a light transmissible tin oxide film.

9. A solid state imaging device comprising:

a semiconductor substrate;

light receiving and accumulating means disposed at a surface area of said semiconductor substrate in a two-dimensional arrangement for photoelectrically transferring received light into a signal charge and for accumulating said signal charge;

transfer means for transferring said signal charge;

a first electroconductive region, located above said light receiving and accumulating means and said transfer means to cover at least portions of said light receiving and accumulating means and said transfer means in a manner electrically insulated from said light receiving and accumulating means and said transfer means, said first electroconductive region including a control electrode; and light shield means for passing incident light only towards a predetermined portion of said light receiving and accumulating means, said light shield means being disposed in direct contact with a lower surface of said first electroconductive region to act as a second electroconductive region over said transfer means to lower the resistance of said first electroconductive region.

* * * * *